(12) United States Patent
Herble et al.

(10) Patent No.: US 6,895,025 B2
(45) Date of Patent: May 17, 2005

(54) OPTICAL SWITCHING APPARATUS

(75) Inventors: Albert Herble, Coton (GB); Jeremy Allam, Guildford (GB)

(73) Assignee: Hitachi Europe, Ltd., Maidenhead (GB)

( * ) Notice: Subject to any disclaimer, the term of this patent is extended or adjusted under 35 U.S.C. 154(b) by 624 days.

(21) Appl. No.: 09/793,893

(22) Filed: Feb. 28, 2001

(65) Prior Publication Data

US 2001/0048783 A1 Dec. 6, 2001

(30) Foreign Application Priority Data

Feb. 28, 2000 (EP) .............................................. 00301567

(51) Int. Cl.⁷ ................................................ H01S 3/10
(52) U.S. Cl. ............................................ 372/9; 372/25
(58) Field of Search .................................. 372/9–25, 8

(56) References Cited

U.S. PATENT DOCUMENTS 5,748,653 A * 5/1998 Parker et al. .................. 372/8

FOREIGN PATENT DOCUMENTS

| GB | 0 744 648 A1 | 11/1996 |
|----|--------------|---------|
| GB | 0 809 128 A1 | 11/1997 |

OTHER PUBLICATIONS

Kobayashi T. et al., *Ultrafast Optoelectronic Devices*, Japanese Journal Of Applied Physics, Supplements, Japan, dated Aug. 27–29, 1991, (XP 000279470), pp. 378–380.

Kobayashi T. et al., *Quantum Electronics And Laser Science Conference* (QELS)—Technical Digest, Paper QWD21: "Coherent push–pull transition for ultrafast optical switching," dated 1991, (XP000933650), pp. 144–145.

* cited by examiner

Primary Examiner—Quyen Leung
(74) Attorney, Agent, or Firm—Kenyon & Kenyon

(57) ABSTRACT

An optical switching apparatus comprises an optically resonant system (3, 12) and a pulse source configuration (1, 2) to direct first and second pulses ($P_1$, $P_2$) of optical radiation into the resonant system, the first pulse ($P_1$) being configured to produce a coherent excitation of the resonant optical system so as to change its optical characteristics and the second pulse ($P_2$) being of a phase to thereafter de-excite the coherent excitation produced by the first pulse. According to the invention, a device (13, 34) driveable externally of the resonant system such as an optical amplifier or a laser, maintains the coherence of the excitation produced by the first pulse until de-excited by the second pulse. The optically resonant system may comprise an optically responsive medium (3) which is capable of being switched into a state of coherent resonance or a resonant cavity.

34 Claims, 13 Drawing Sheets

Implementation examples

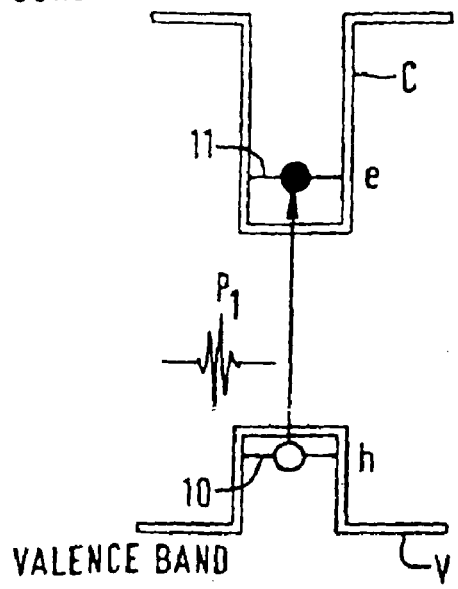
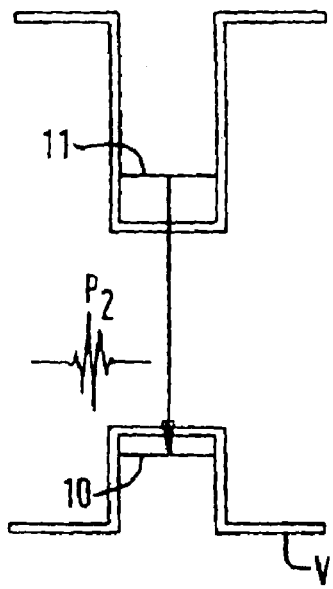
FIG. 3A — EXCITATION
FIG. 3B — DEEXCITATION BY COHERENT DESTRUCTION
FIG. 4
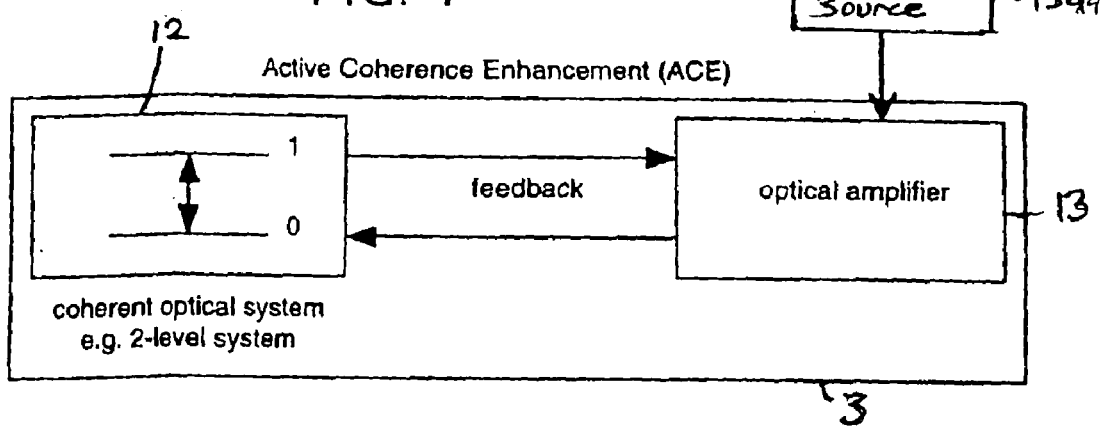

Implementation examples separated [a]
Coherent medium | Saturable absorber | Amplifying medium

[b] layered system

[c] DFB either by layer structure or by grating combined [d]
Active+coherent medium combined e.g. in semiconductor laser, VCSEL

[e] DFB-feedback instead of cavity to avoid propagation delay

Optical switching

Switching stop band or resonances

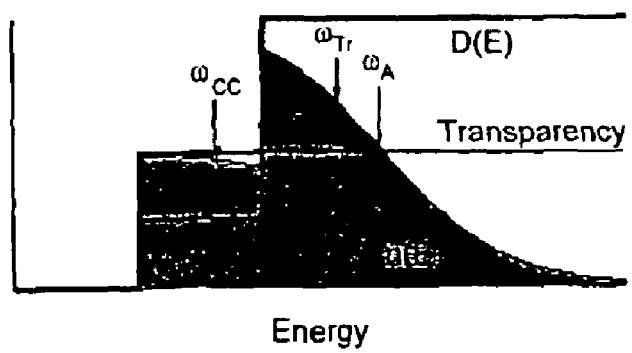
Figure 23
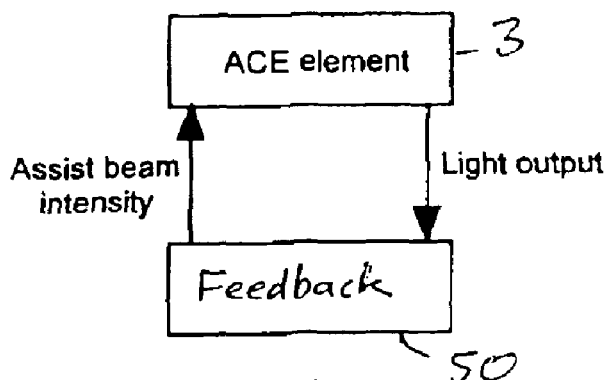
Figure 24
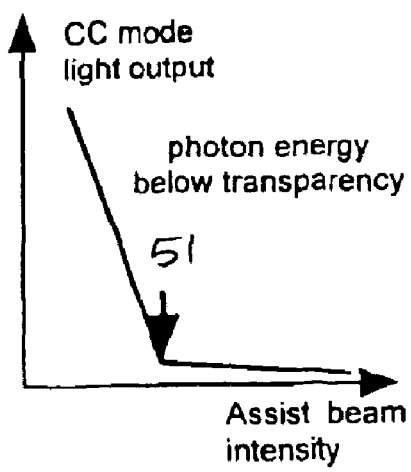
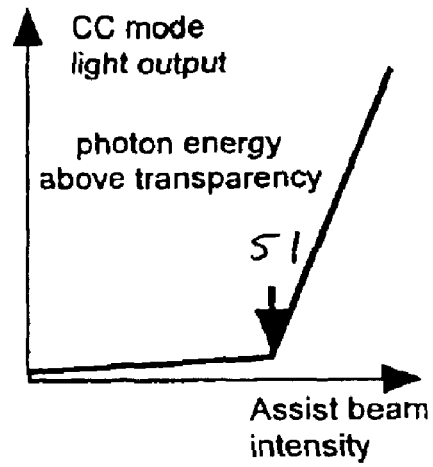
Figure 25          Figure 26

OPTICAL SWITCHING APPARATUS

FIELD OF THE INVENTION

This invention relates to optical switching apparatus, which may be used in a fast optical switch.

BACKGROUND OF THE INVENTION

It has previously been proposed to switch an optically responsive medium resonantly using pulses in antiphase. For example, in EP-A-0 744 648, optically generated charge carriers are produced in an optical medium, in response to a first pulse of optical radiation and are thereafter de-excited by directing a second pulse into the medium. A second pulse occurs whilst the excitation produced by the first pulse remains coherent, and the relative phase of the first and second pulses is selected so that the second pulse destructively interferes with the excitation produced by the first pulse. The apparatus may be used as an optical switch in a modulator or a photodetector.

Reference is also directed to Kobayashi T. et al, "Coherent push-pull transition for ultrafast optical switching", Quantum Electronics and Laser Science Conference (QELS) 1991-QELS, 91 Technical Digest, paper QWD 21, pages 144–145.

A problem with the prior techniques is that the excitation produced by the first pulse has a coherence time of the order of picoseconds or shorter at room temperature, with the result that the second pulse needs to occur within a very short time after the first pulse in order to achieve coherent de-excitation. As a result, the prior systems have been operated at low temperature in order to extend the coherence time of the excitation produced by the first pulse.

SUMMARY OF THE INVENTION

The present invention provides an alternative approach. According to the invention there is provided optical switching apparatus, comprising an optically responsive system a pulse source configuration to direct first and second pulse components of optical radiation into the optical system, the first pulse component being configured to produce a coherent excitation of the optical system so as to change its optical characteristics and the second pulse component being of a phase to thereafter produce de-excitation of the coherent excitation produced by the first pulse component, and a device driveable externally of the system to maintain the coherence of the excitation produced by the first pulse component until the de-excitation due to the second pulse component.

Thus, in accordance with the invention the externally driven device permits the excitation produced by the first pulse component, to be maintained thereby extending the time window in which the second pulse component can occur to achieve coherent de-excitation.

The externally driven device may comprise an optical amplifier in which an amplifying medium is configured to be driven by power from an external source to maintain the excitation produced by the first pulse until de-excited by the second pulse. The amplifier may be configured to be pumped by an external optical source, to maintain the excitation produced by the first pulse component until de-excited due to the second pulse component, or may be driven by an external electrical power supply.

A saturable absorber or other suitable means may be included to suppress stimulated emission in the optical medium.

Also, the device external to the optical system may comprise a laser to feed coherently polarised radiation into the optical system such that the first pulse produces an increase in the degree of coherent excitation in accordance with the optical Bloch equations—see "Optical resonance and two-level atoms" L. Allen & J. H. Eberly, Dover, N.Y., 1975 and generalisations thereof "Quantum theory of the optical and electronics properties of semiconductors" H. Haug and S. W. Koch, World Scientific—Singapore, 1993, which is maintained by the radiation until de-excited by the second pulse.

The optical system may comprise an optically responsive medium capable of being excited into an excited state by the first pulse component or may be a resonant structure which can be brought into resonance by the first pulse component.

There may also provided a means of optical feedback between the resonant optical system and the externally driven device, such that the light fed back to the resonant optical system exhibits a fixed phase relationship (typically in-phase) with the optical excitation of that system.

BRIEF DESCRIPTION OF THE DRAWINGS

In order that the invention may be more fully understood, the embodiments thereof will be now be described by way of example with reference to the accompanying drawings in which:

FIGS. 3a and 3b illustrate excitation and de-excitation of a charge carrier in the optical medium shown in FIG. 1 in response to successive pulses $P_1$ and $P_2$;

FIG. 4 is a schematic block diagram of the functionality of the optical medium shown in FIG. 1

FIG. 23 is a graph of the density of states versus carrier density for an ACE element showing a transparency point for use with an assist beam to control gain;

FIG. 24 is a schematic diagram of an ACE element connected in a feedback loop wherein an assist beam is used for gain control;

FIGS. 25 and 26 illustrate the intensity of a coherently controlled mode of the ACE element as a function of the intensity of the assist beam, above and below the transparency threshold respectively;

DETAILED DESCRIPTION

Figure 1:
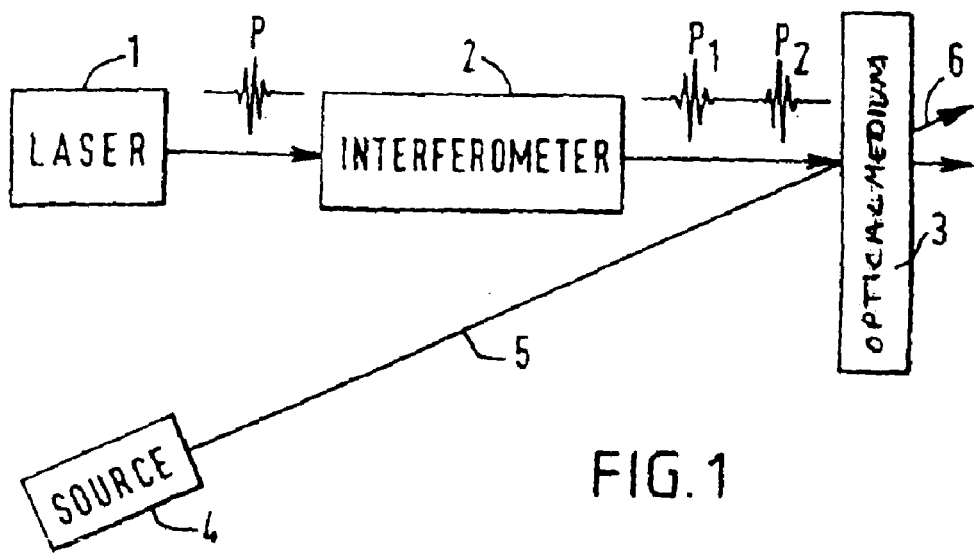
FIG. 1 is a schematic overview of an optical switch in accordance with the invention.

Referring to FIG. 1, which is a schematic overview of optical switching apparatus according to the invention, a pulsed femtosecond laser source 1 produces short duration pulses of duration e.g. <1 ps typically at a wavelength of 600 nm, 800 nm, 1.3 µm or 1.5 µm for optical fibre communication, which are fed through an interferometer 2 into a resonant optical system. In this example, the resonant optical system comprises an optically responsive medium 3 which is capable of being switched into a state of coherent resonance, such as a saturable absorber. The optical medium 3 includes additional functionality to be described in more detail hereinafter. In this illustrative example, the saturable absorber is a semiconductor. Normally, the absorber is optically non-transmissive but in response to a pulse P from the laser, is switched into transmissive state. This is used to switch an input optical beam from source 4 that passes along an input path 5 to the optical medium 3. The beam passes to an output path 6 through the optical medium when its absorber is switched to a transmissive state by a pulse P from the laser 1. The beam from source 4 can also be modulated by the change in refractive index n of the responsive medium.

As is well known in the art, the effect of the pulse P is to excite an electron in the valence band of the absorber into the conduction band, with the result that the absorber changes from an optically non-transmissive state to an optically transmissive state due to the creation of an electron-hole-pair, known as an exciton. Thereafter, this resonant transition decays back to a non-excited state. This optical transition, which is resonantly excited by the short pulse from the laser 1, stays coherent with the radiation forming the optical pulse P for a time $T_2 = h/\pi\Gamma$ where is $\Gamma$ the homogeneous linewidth of the transition and h is Heisenberg's constant. The coherence decays exponentially with time.

A second pulse $P_2$ is applied to de-excite the optical transition produced by the first pulse $P_1$. The second pulse is applied to the absorber within a short time $\Delta T$ following the first pulse, during which the excitation produced by the first pulse remains coherent, and the second pulse is 180° out of phase with the first pulse at the transition wavelength $\lambda_a$. As a result, the second pulse $P_2$ causes de-excitation by destructive interference.

Thus, if $\Delta T << T_2$ with the optical radiation of the first and second pulses being 180° out of phase, the technique permits optical excitons to be switched on and off for very short, well defined periods of time. The time resolution for this technique is limited by the width of the applied pulses P, which may be of the order of 6 fs.

In order to produce the first and second pulses, the pulse P from the laser 1 is fed to the interferometer 2, for example a Michelson, Mach-Zehnder or Sagnac type interferometer, which produces two pulses $P_1$ and $P_2$ spaced apart in time by the short period $\Delta T$. The pulse P from the laser 1 has a centre wavelength $\lambda_a$ which corresponds to a narrow absorption line for the saturable absorber 3. In order to ensure that the pulses $P_1$ and $P_2$ are 180° out of phase, i.e. to ensure destructive interference, the interferometer 2 is configured to produce a temporal separation between the pulses as follows:

$$\Delta T = (n + \tfrac{1}{2})\lambda_a/c$$

where n is an integer and c is the speed of light. It is possible that the excitation changes $\lambda_a$, in which case $\Delta T$ will need to be changed slightly from the value given by this formula in order to achieve destructive interference.

The interferometer 2 is configured to set the integer n to a value that achieves the required pulse delay between the pulses $P_1$ and $P_2$ to achieve the desired destructive interference.

Although in this example an interferometer is used to produce the pulses $P_1$ and $P_2$, those skilled in the art will envisage alternative techniques that could be used to produce the pulses. In fact, it is not necessary to use discrete pulses $P_1$ and $P_2$ as previously described. For example a so-called "zero π" pulse as described by Allen and Eberly supra can be used to produce the coherent excitation and de-excitation. Furthermore, one or more intermediate pulses between the first and second pulses $P_1$ and $P_2$ can be used as part of the overall coherence control arrangement. Thus, it will be understood that the pulses $P_1$ and $P_2$ in the foregoing example are but one example of first and second pulse components which can be used to produce the coherent excitation followed by switched de-excitation in accordance with the invention.

Figure 2A:
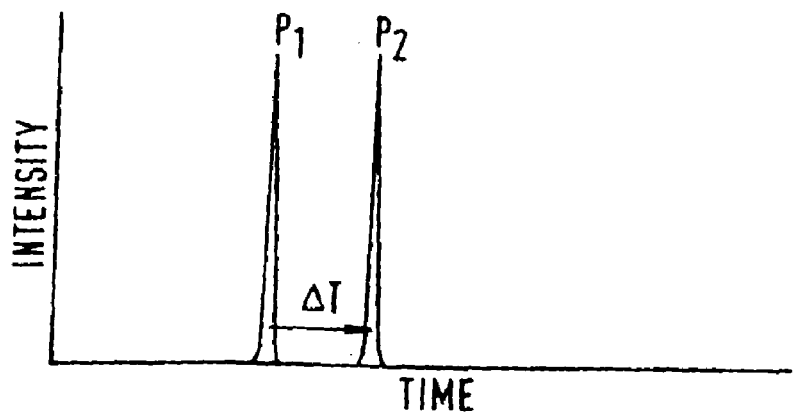
FIGS. 2a and 2b are graphs of the intensity of successive pulses $P_1$ and $P_2$ with time, and the corresponding change in optical transmission characteristics of an optical medium.
Figure 2B:
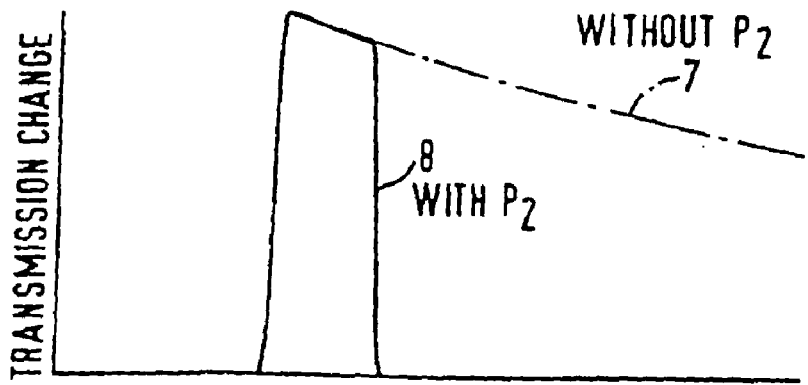

FIG. 2 illustrates the operation of the optical switch. FIG. 2A shows the timing of the first and second pulses $P_1$ and $P_2$. The first pulse $P_1$ produces an exciton in the saturable absorber with the result that its transmission characteristics change as shown in FIG. 2B. In the absence of pulse $P_2$, the resulting resonant excited state will decay relatively slowly as shown by the hatched line 7 in FIG. 2B. However, pulse $P_2$ produces a switched de-excitation of the resonant state in a rapid manner, as shown by the curve 8 in FIG. 3A. Because the pulse $P_2$ occurs within the time ΔT whilst the resonant excited state remains coherent with pulse $P_1$, and because pulse $P_2$ is in antiphase to pulse $P_1$, rapid de-excitation of the resonant state occurs.

This is explained in more detail in FIG. 3. In FIG. 3A, the pulse $P_1$ produces a resonant excitation in which an electron e is resonantly driven from a "zero state" energy level 10 in the valence band V to an energy level 11 representing a "one state" in the conduction band C. The antiphase pulse $P_2$ positively drives the electron from the level 11 in the conduction band back to the valence band V thereby producing de-excitation by coherent destruction. This coherent two level system is described in more detail in co-pending EP-A-0744648.

The usefulness of this technique at room temperature is usually limited by the coherence time $T_2$ of the excitation produced by the first pulse $P_1$. At room temperature, the coherence time is the picosecond range or shorter, which means that hitherto, the technique has only been used at low temperatures. In accordance with the invention, an externally driven device is used to maintain the coherence produced by the first pulse $P_1$ until at least in part de-excited by the second pulse $P_2$.

The device may comprise an optical amplifier. The amplifier may be integrated into the optical medium 3 and an illustration of the resulting functionality is shown in FIG. 4. The optical medium 3 includes the aforesaid coherent optical medium capable of being switched between two levels as previously described, namely material 12, together with material 13 which acts as an optical amplifier medium. The amplifier 13 is driven by an external power source 13a that acts to amplify the excitation produced by the first pulse $P_1$ i.e. to maintain the coherence of the "one state" previously described with reference to FIG. 3. Thus, the optical amplifier provides a feedback mechanism for the coherent optical medium 12 so as to maintain the coherent state produced by the pulse $P_1$ for an extended duration until de-excited by pulse $P_2$. In this way, the effective coherence time $T_2$ can be extended by the amplifier 13 beyond the period that would normally occur (in the absence of the amplifier) so that the system can operate at room temperature.

The device 3 thus produces active coherence enhancement (ACE) and will be referred to herein as an ACE element or device. It will be understood that the amplifier 13 can be powered optically or electrically. Thus, the medium 3 may be provided with an external optical pump source 13a or an electric field through external electrodes (not shown) connected to an external electrical source.

Figure 5:
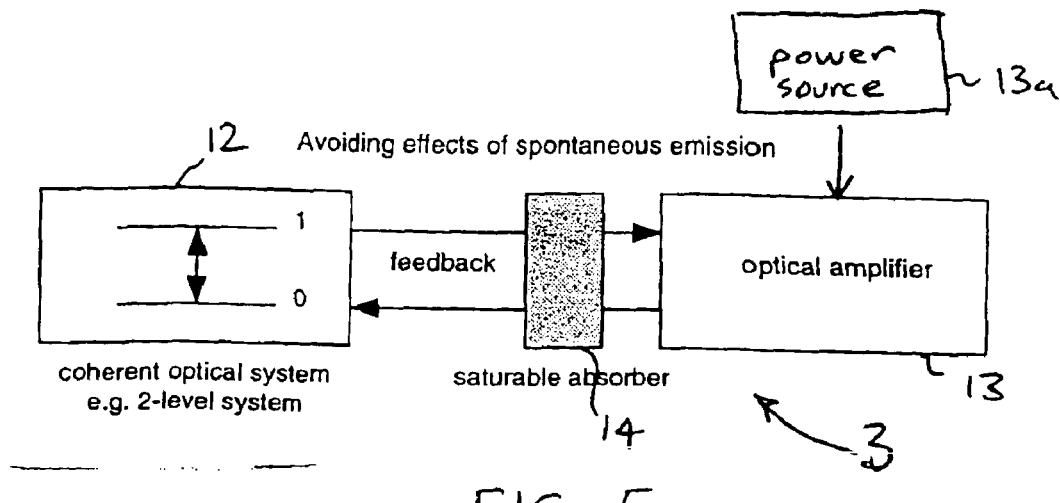
FIG. 5 is a schematic illustration of a modification of the arrangement shown in FIG. 4.

A modification to the system is shown in FIG. 5, in which a saturable absorber 14 is included to avoid the effects of spontaneous emission that may occur due to the amplification produced by the amplifier 13.

Figure 6:
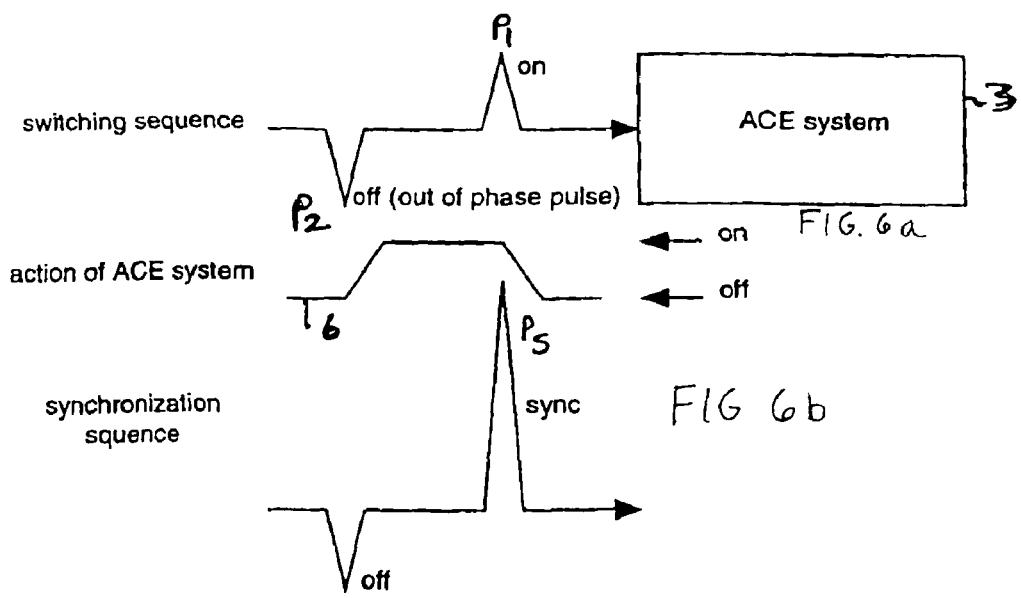
FIG. 6a is a schematic illustration of the switching carried out by the optical switch.
FIG. 6b illustrates a synchronisation sequence for the switch.

FIG. 6 is a schematic illustration of the system operation. The pulses $P_1$ and $P_2$ are applied to the optical medium 3 to switch it coherently from the one and zero states as previously described with reference to FIGS. 1 to 3. The action of the amplifier 13 is to maintain the coherent "one state" induced by pulse $P_1$ until it is coherently switched to the "zero state" by the antiphase pulse $P_2$. As a result, the beam from laser 4, on path 6 shown in FIG. 1, is switched from an off to an on state for the period between the pulses $P_1$ and $P_2$, as shown in FIG. 6a.

It will be understood that the switching technique according to the invention can be used for any suitable optical transition. Thus, in the examples described, the optical medium 3 may comprise quantum well semiconductor material as described in EP-A-0 744 648 but the technique can equally well be used for quantum wires or layer structures. Also, optical transitions in polymers or optical atomic transitions can be coherently switched in accordance with the invention.

FIG. 6b illustrates an initialisation method for the system. In order to set the states of the material 12 in the optical medium 3, an initial relatively large synchronisation pulse $P_1$ is applied, followed by the pulse $P_2$ to switch the material 12 to the "zero state". The system can then be switched on and off as shown in FIG. 6a.

FIG. 7 illustrates different implementations of the optical medium 3. Referring to FIG. 7a, the optical medium 3 may comprise layers of the coherent medium 12, optical amplifier medium 13 and saturable absorber 14. The layers 12, 13, 14 may overlie one another and may be disposed in a resonant structure such as a Fabry Perot etalon that includes reflective surfaces 15, 16, generally as described in copending EP-A-0 744 648 supra. The purpose of the etalon is to increase the effective path length of the pulses $P_1$, $P_2$ in the optical medium 3 and produce optical feedback. The materials 12, 13, 14 may be built up in a multi-layer structure within the etalon as shown in FIG. 7b. In fact, the layered system shown in FIG. 7b may itself give rise to a grating structure which forms a stop band at the wavelength of the source 4 shown in FIG. 1. Thus, the pulses $P_1$ and $P_2$ can be used to switch the stop band on and off so as to act as an optical switch for the source 4. In this way, the reflective surfaces 15, 16 can be omitted. If desired, a grating structure can be applied by external means, for example by mechanical milling, e-beam lithography and chemical etching or by recording a refractive index pattern in the material concerned, as well known in the DFB laser art. Reference is directed to "Semiconductor Lasers" G. P. Agrawal, N. K. Dutta, Van Nostrand Reinhold, N.Y., 1993.

Examples of suitable materials for the coherent medium 12, the amplifier 13 and saturable absorber 14 are: GaAs, $Al_xGa_{1-x}As$, InP, $In_xGa_{1-x}As$, $Al_aGa_yIn_{1-x-y}P$, $In_xGa_{1-x}As_yP_{1-y}$, $Ga_xIn_{1-x}P_yAs_{1-y}$, together with quantum wells and superlattices thereof, quantum wires, quantum dots and arrays thereof.

Alternative forms of resonant structure can be used. For example the optical medium 3 can be included in a ring resonator It is possible to achieve the functionality of the coherent medium 12, amplifier medium 13 and saturable absorber 14 in a single material, for example a semiconductor, arranged in a laser cavity e.g. a vertical cavity semiconductor laser (VCSEL). This is shown schematically in FIG. 7d, in which a semiconductor material 17 which exhibits the combined functionality of the regions 12, 13 and 14 previously described, is disposed between semi-reflective surfaces 15, 16. Thus, in response to pulse $P_1$ the laser is switched into resonance and, in response to the coherent, antiphase pulse $P_2$, the laser is switched off. When switched off, the laser will not pass light from the source 4 shown in FIG. 1, but when switched on, allows the beam 5 to pass through it, thereby acting as a switch for the source 4. The VSCEL may for example comprise a multiple layered structure with a quantum well structure formed of $In_xGa_{1-x}As$ e.g. where x=0.1, sandwiched between distributed mirrors formed of multiple layers of AlAs/GaAs.

Figure 7A:
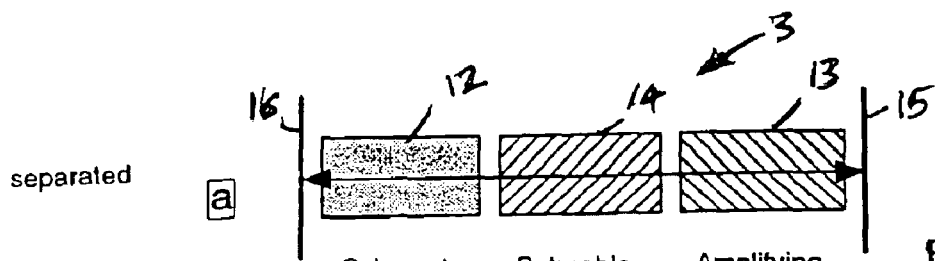
FIGS. 7a–e illustrate different examples of the structure of the optical medium.
Figure 7B:
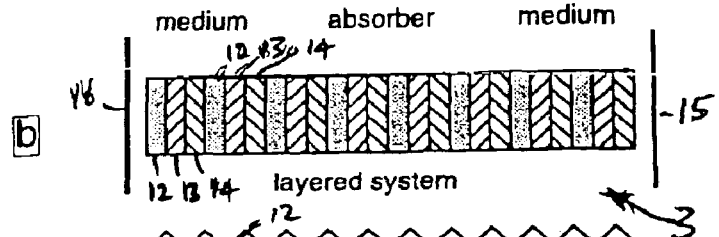
Figure 7C:
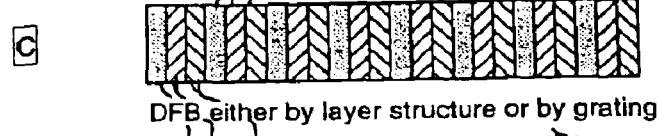
Figure 7D:
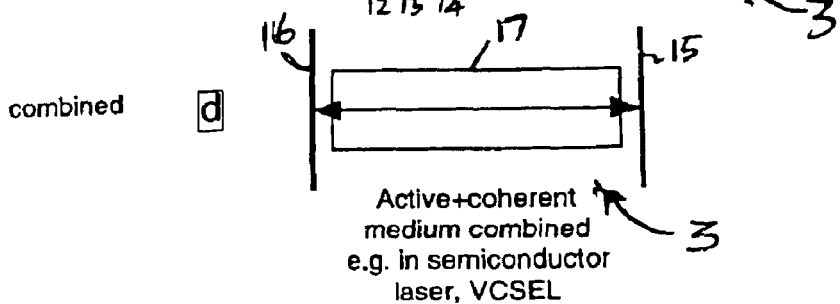
Figure 7E:
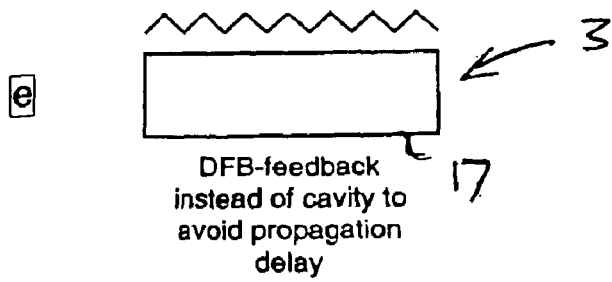

In a modification shown in FIG. 7e, the reflective surfaces 15, 16 are omitted and a distributed feedback arrangement is provided, in the form of a grating, in order to avoid propagation delays within the material 17 produced by the reflectors 15, 16 shown in FIG. 7d. Examples of a suitable semiconductor material are described hereinbefore. The grating may be obtained by any of the above mentioned known methods.

Figure 8A:
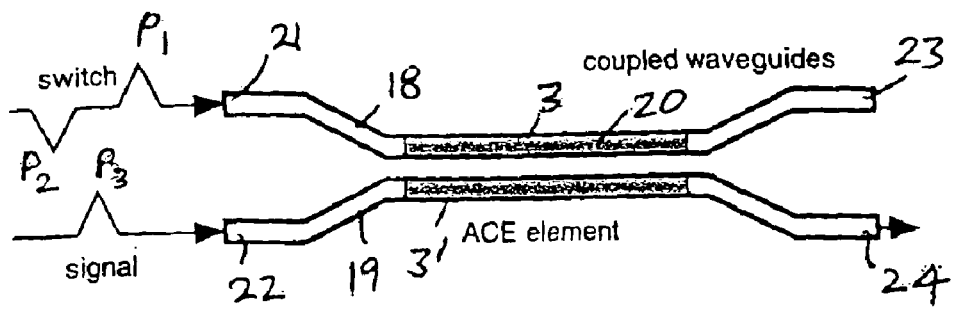
FIGS. 8a and 8b illustrate alternative embodiments of waveguide switches in accordance with the invention.

In the system described up to now, the material 12 has been switched between relatively excited and de-excited states, which results in a change in its optical refractive index and this affect can be used with advantage to implement the invention in an optical waveguide arrangement. Referring to FIG. 8a, a conventional four port evanescent coupler is shown, in which two waveguides 18, 19 are brought into close proximity to provide a coupling region 20. As well known in the art, optical signals passing in one of the waveguides 18, 19 can couple to the other waveguide in the coupling region 20 by evanescent coupling. The coupler may be formed from optical fibres or, preferably, waveguides formed in a common semiconductor substrate, for example as described in "Guided Wave Optoelectronics" Ed. Th. Tamin, G. Griffel & H. L. Bertoni, Plenum Press, London 1995. Such fabrication techniques are well known and will not be described further herein.

Each of the waveguides 18, 19 is provided with the optical medium 3 in the coupling region 20.

In the example shown in FIG. 8a, the time spaced, antiphase pulses $P_1$, $P_2$ are supplied to input 21 of waveguide 18, whereas a signal pulse $P_3$ e.g. from source 4 of FIG. 1, is supplied to input 22 of waveguide 19.

The action of pulse $P_1$ is to switch the refractive index of the optical medium 3 in waveguide 18 to a different value and the pulse $P_2$ switches the refractive index back again. When the pulse $P_3$ occurs between pulses $P_1$ and $P_2$, the imbalance in the refractive indices of the regions 3, 3' in the coupling region 20, causes the pulse $P_3$ to transfer between the waveguides and proceed to output 23. However, if the signal $P_3$ occurs in time either before $P_1$ or after $P_2$ the refractive index arrangement in the coupling region 20 is symmetrical and as a result, the pulse $P_3$ passes to output 24. It will be understood that the optical medium 3 need be provided in only one of the waveguides but may be provided in both for convenience of manufacture and so that, if desired, switching pulses can be applied to input 22 rather than input 21 as shown.

Figure 8B:
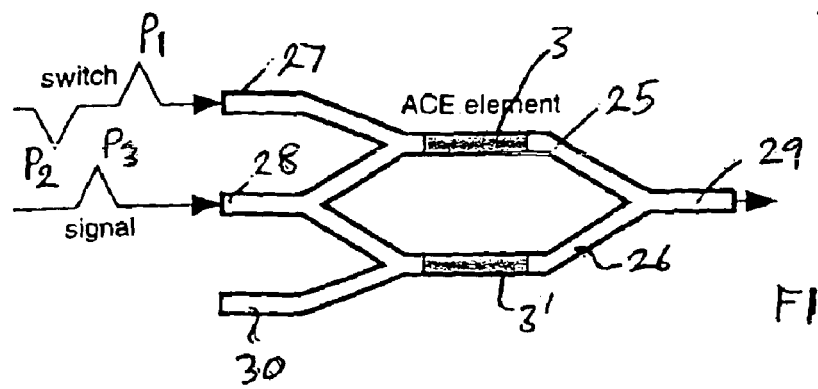

Alternatively, a Mach Zehnder interferometer fabricated according to the techniques described by Tamin et al, supra can be used as shown in FIG. 8b. The interferometer has arms 25, 26 which include respective regions 3, 3' of the optical medium. The switching pulses $P_1$ and $P_2$ are applied to an input 27 so as to switch the refractive index of the optical medium 3 in arm 25. The signal pulse $P_3$ is applied to input 28 so as to pass into both of the arms 25, 26. If the pulse $P_3$ occurs between pulses $P_1$ and $P_2$, the refractive index of the arm 25 will be different from the refractive index of arm 26 due to the switching effect of the pulses $P_1$, $P_2$ and, as a result, there is a difference in the path length presented by the arms 25, 26 to the signal $P_3$. As a result, interference occurs in the output 29 and the signal $P_3$ is switched off. However, if the pulse $P_3$ occurs either before pulse $P_3$ or after pulse $P_2$, the refractive indices of the arms 25, 26 are symmetrical and as a result, the pulse $P_3$ passes to the output 29. The arrangement includes a further input 30 so that, if desired, the element 3' can be switched individually by the application of additional switching pulses to input 30.

Figure 9A:
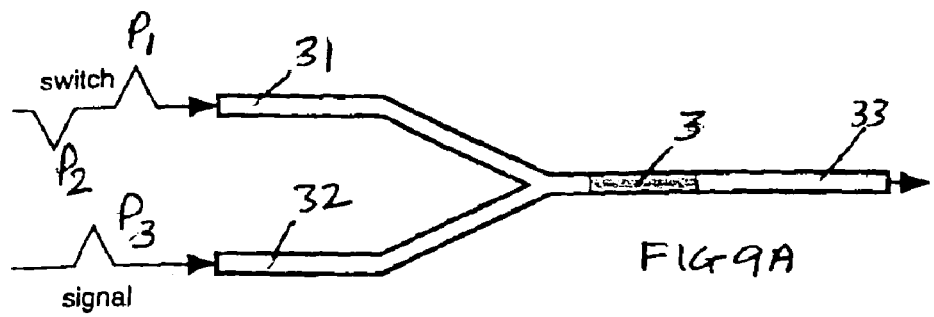
FIG. 9 illustrates a further optical switch in a waveguide, according to the invention.
Figure 9B:
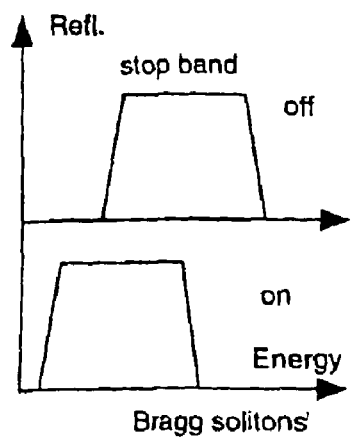
Figure 9C:
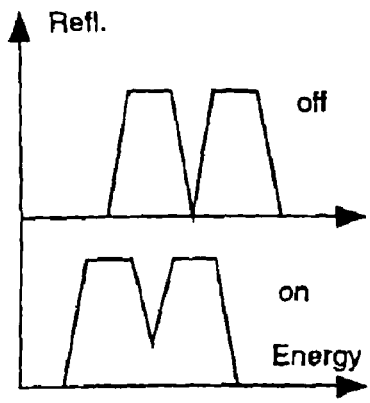

FIG. 9 illustrates a further embodiment in which a two port waveguide coupler includes a region of optical medium 3 that includes a band stop filter such as an optical grating, for example as previously described with reference to FIGS. 7b, 7c or 7e. The switching pulses $P_1$, $P_2$ are applied to input port 31 and the signal pulse $P_3$ is applied to input port 32. The switching pulses $P_1$, $P_2$, in use, switch the stop band of the grating associated with medium 3. The wavelength of pulse $P_3$ is selected so that when the pulse $P_3$ occurs between pulses $P_1$ and $P_2$ the stop band of medium 3 is not tuned to the wavelength of pulse $P_3$, and as a result, the pulse $P_3$ passes to output 33. However, if pulse $P_3$ occurs either before pulse $P_1$ or after pulse $P_2$, the stop band of medium 3 is an tuned condition relative to the wavelength of pulse $P_3$ and as a result, the pulse is reflected so that it does not reach output 33.

Figure 10:
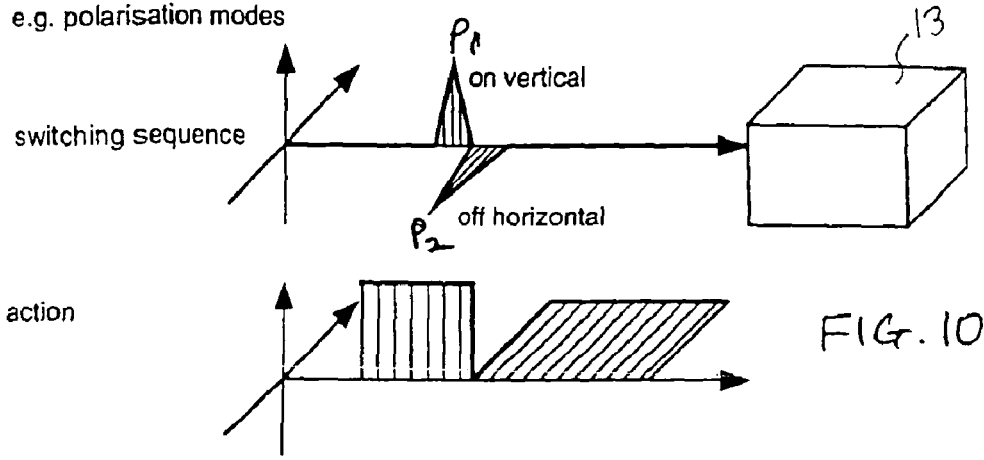
FIG. 10 illustrates how successive switching pulses may be polarised in different planes to reduce change of inversion and gain.

As known in the art, the gain of the amplifier 13 is a function of the input electrical signals and this can produce imbalances in the optical system. Thus, as soon as the input signal to the amplifier is switched off, its inversion and hence its gain will change. The arrangement shown in FIG. 10 overcomes this difficulty. The successive on and off pulses $P_1$, $P_2$ are polarised in different modes such that each successive on and off cycle of the amplifier is carried out in a different optical polarisation mode. Thus, as shown in FIG. 10, an off pulse $P_2$ may be in a horizontal polarisation mode for the amplifier 13. When the next subsequent on pulse $P_1$ occurs, it is disposed in a vertical polarisation mode. Thus, successive switching cycles occur in orthogonal modes contiguously. As a result, the gain of the amplifier remains constant. The ability to switch successive modulations of the switch in different polarisations facilitates high speed switching. This approach allows the "on" and "off" pulses to be represented by parameters other than optical density. Thus, the previously described "on" and "off" pulses, $P_1$ and $P_2$ are constituted by a pulse sequence which first turns on the vertical polarised state $P_1$(vert) and then turns off the vertical state and concurrently turns on the horizontal polarised state $P_2$(horiz), which is itself turned off at the end of the switching sequence. The excitation of the horizontal state is turned off at the start of the excitation of the vertical state and vice versa such that the total optical gain is approximately constant.

Other switching vectors can be used, such as circular polarisations, different wavelengths or the mode of the cavity, in order to achieve an essentially constant gain. Thus, state vectors other than optical intensity can be used.

Figure 11:
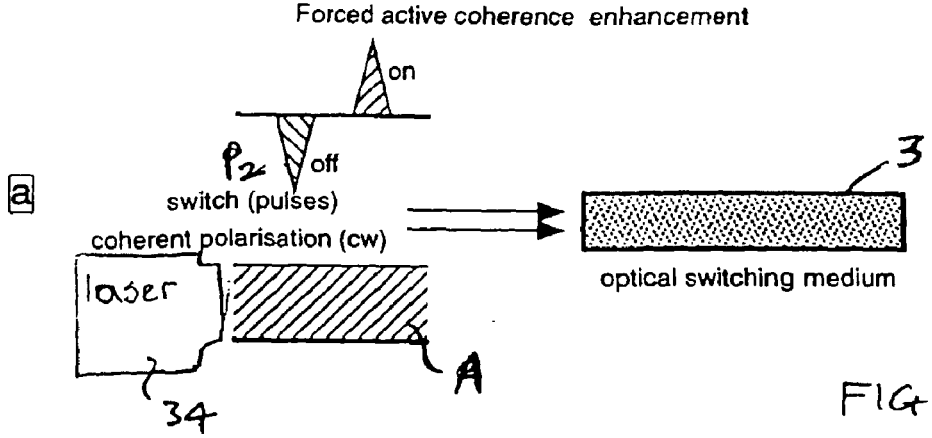
FIG. 11 is a schematic illustration of a forced polarisation technique.
Figure 12:
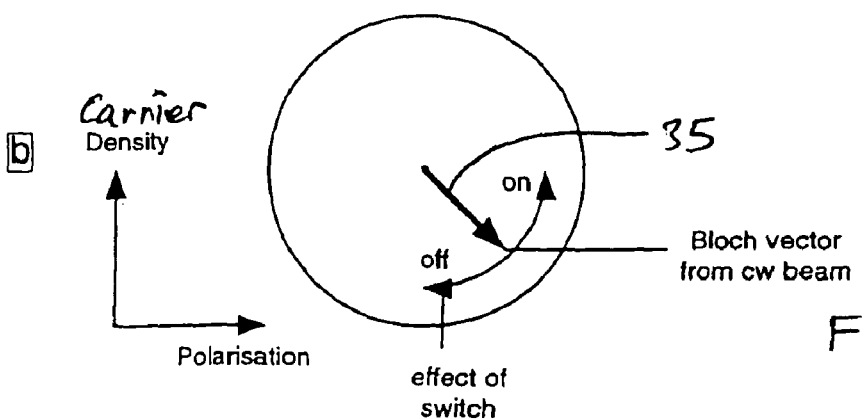
FIG. 12 is a Bloch vector diagram illustrating operation of the switching technique shown in FIG. 11.

An alternative mechanism for maintaining coherence in the optical switching medium 3 will now be described with reference to FIG. 11. In this embodiment, a continuous, coherent, uniformly polarised radiation is fed into the optical switching medium 3 from a laser 34, as an assist beam A to assist in maintaining the coherence of the optical medium. As a result, the optical switching medium is forced to maintain its coherence despite its natural phase relaxation characteristic. The first switching pulse $P_1$ is in phase with the assist beam A and therefore increases the carrier density in the optical switching medium. FIG. 12 is a Bloch vector diagram of the carrier density within the optical switching medium 3. Reference is directed to "Optical resonance and two-level atoms" L. Allen & J. H. Eberly, Dover, N.Y., 1975 and generalisations thereof "Quantum theory of the optical and electronics properties of semiconductors" H. Haug and S. W. Koch, World Scientific—Singapore, 1993. It will be seen that the on pulse $P_1$ shifts Bloch vector 35 anticlockwise as a result of the increased carrier density. This state is maintained as a result of the input coherent radiation from laser 34 notwithstanding the optical medium's natural tendency for the state to decay with time. The effect of the subsequent off-switching pulse $P_2$ is to rotate the Bloch vector 35 in a clockwise direction because it is in antiphase and reduces the charge carrier density. As previously explained, the change in carrier density changes the optical characteristics of the switching medium and so can be used in an optical switch as previously described. It will be understood that the optical switching medium 3 shown in FIG. 11 need not necessarily include an amplifier 13.

The temporal evolution of the ACE element 3 is determined by its roundtrip optical gain, namely the gain in the optical loop shown e.g. in FIG. 5. The optical intensity in the ACE element is given by $$\frac{dI(t)}{dt} = \frac{\ln g_r(t)}{t_r} I(t) + I_p(t)$$

where $g_r$ is the roundtrip gain and $t_r$ is the roundtrip time. The term $I_p(t)$ describes the effect of the previously described externally injected control pulses. In the case of a distributed system e.g. as shown in FIG. 7c, the formula above has to be considered for the limit $t_r \to 0$. The temporal evolution of the ACE element can exhibit unwanted effects like relaxation oscillations and the growth of significant optical intensity out of spontaneous emission from the ACE system. Therefore accurate control of $g_r$ is needed in many cases. For the case of constant gain, $g_r$=const and absence of control pulses in the time interval considered $I_p(t)$=0, it can be shown that $I(t)=I_0 g_r^{(t/t_r)} = I_0 \exp(t/\ln g_r/t_r)$. In the stationary state ($I(t)$=constant) this requires $g_r$=1 for active modes. If such an active mode is being used for coherent control in an ACE element (e.g. in a DFB laser), the device initially can be in the on state with a random optical phase. Therefore preparation for coherent control operation requires synchronization to the phase of the control pulses as shown in FIG. 6b. To avoid these complications it is advantageous to design a device that normally is in the off state and returns to the off state after sufficiently long time if no pulses are injected. This concept will also avoid residual excitation in the case of imperfect destructive interference.

These problems can be solved by modifying the devices so that the roundtrip gain $g_{rCC}$ of the mode to be coherently controlled (CC) is configured so that $g_{rCC}<1$. The intensity in this mode will then decay exponentially $I_{CC}(t)=I_0\exp(-t/\tau_{CC})$, where $\tau_{CC}$ is a decay constant given by $\tau_{CC}=-t_r/\ln(g_{rCC})$. The decay constant in general is adjusted to be significantly longer than the pulse separation for coherent control, $\tau_{CC}>>\Delta T$. The condition $g_{rCC}<1$ can be achieved e.g. by (1) balancing the maximum gain of the optical amplifier 3 with the loss of the loop, (2) by adjusting the power supply 13a of the optical amplifier 3 to nearly compensate the loss of the loop, (3) by depleting the amplifier gain with externally injected light or (4) by depleting of the gain with at least one auxiliary mode in the element 3. These options will now be discussed in more detail.

Figure 13:
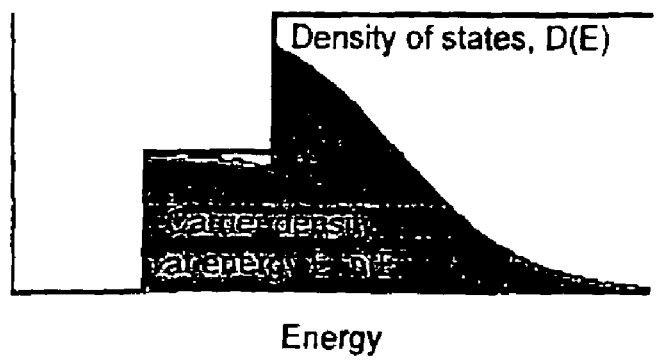
FIG. 13 is a graph of the density of states versus carrier density for an optical amplifier acting as an active coherence enhancement (ACE) element.

(1) Limitation of the Maximum Gain of the Optical Amplifier 3:

FIG. 13 shows the density of states, D(E), and carrier density, n(E), versus energy E of the optical amplifier 3, which is a semiconductor quantum well device in this example. Since D(E)>n(E), D(E) always limits the optical gain $\alpha(E)$ at Energy E, to a maximum value $\alpha_{max}(E)$, independent of the total carrier density $n_{tot}=\int n(E) dE$. An appropriate choice of material parameters and dimensions can therefore be made so as to limit $\alpha(E)$ independently of current injection and thereby ensure that $g_{rCC}<1$. This method also works in quantum dots, quantum wires, bulk semiconductors, or other optical amplifiers.

Figure 14:
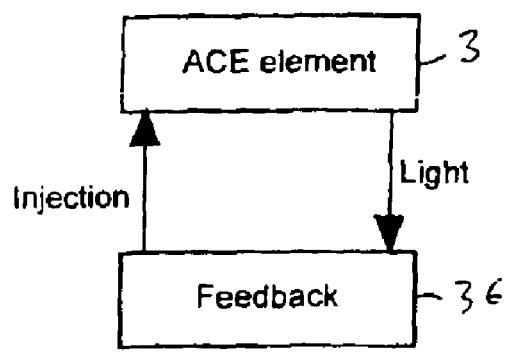
FIG. 14 is a block diagram of an ACE element connected in a feedback loop to control its injection power.
Figure 15:
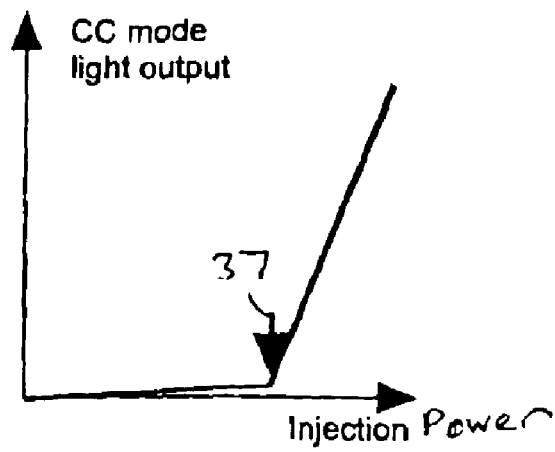
FIG. 15 is a graph of the power a controlled coherence mode as a function of injection power into the ACE element.
Figure 16:
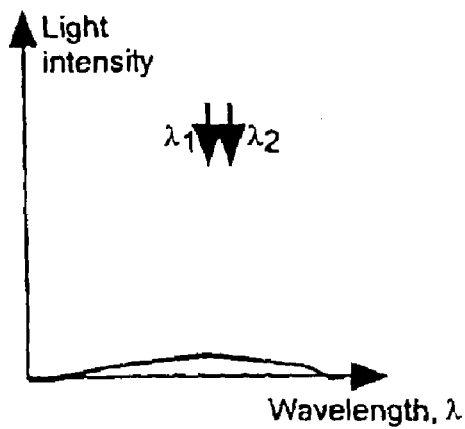
FIGS. 16 and 17 are graphs of the output optical intensity versus wavelength characteristic of the ACE element respectively above and below the threshold level of injection power shown in FIG. 15.
Figure 17:
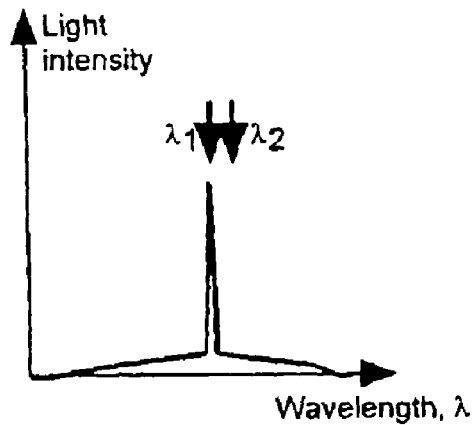

(2) Control of the Injection Power:

In some cases it may be advantageous to have a freely adjustable gain not limited by a maximum value imposed by the methodology just described. In order to achieve this goal, the injection into the device e.g. from power source amplifier 13a shown in FIGS. 4 and 5, can be adjusted to ensure $g_{rCC}<1$. Referring to FIG. 14, in which the ACE element 3 is shown in a feedback loop with a feedback control circuit 36. The control circuit 36 reduces injection into the element 3 as soon as the light output increases above a certain level to ensure that $g_{rCC}<1$. Furthermore, instead of the optical gain, the optical loss can be controlled to satisfy $g_{rCC}<1$. The feedback control circuit 36 may control the injection into the element 3 by comparing the optical output intensity from element 3 with a reference light intensity and FIG. 15 shows how the reference light intensity for the feedback circuit should be chosen. The output intensity of the CC mode increases slowly as a function of injection current until it reaches threshold at $g_{rCC}=1$ marked by arrow 37 and then increases much more quickly. Therefore, as explained in more detail later, the reference value for the feedback loop should be set to a point slightly below this threshold. FIG. 16 shows a typical output spectrum of the ACE element below the threshold and FIG. 17 shows the situation above the threshold. Above the threshold, the CC mode produces a narrow line (with a line width that may be below 1 nm) at a wavelength $\lambda_1$. Therefore, an optical line filter in the feedback circuit can help to suppress background light and light from the spectrally wide pulses for coherent control.

Figure 18:
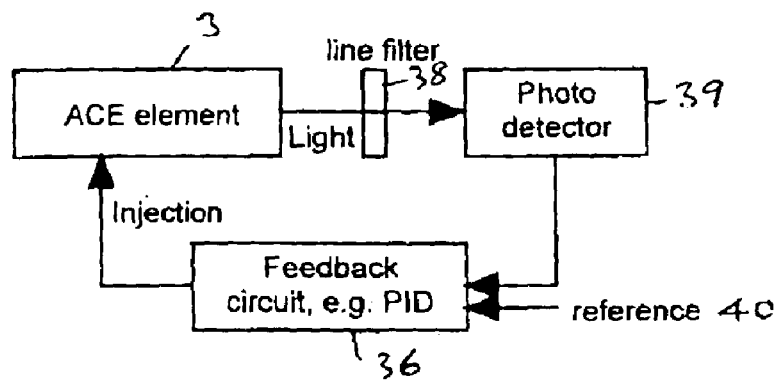
FIG. 18 is a schematic diagram of an ACE element connected in a feedback loop.

FIG. 18 shows of an implementation of the feedback circuit 36 in more detail. The light from the ACE element 3 passes through a line filter 38 and is detected by a photo detector 39 e.g. a PIN diode, which produces the electrical input signal for the feedback circuit 36, which may conveniently comprise a PID regulator. The circuit 36 has an input 40 to receive a setting signal for the reference level 37, which is set to the signal level produced by the photodetector when the ACE element 3 is just below or at threshold. As shown in FIGS. 16 and 17, it can be useful to use the difference in light intensity between the CC mode at wavelength $\lambda_1$ and a neighbouring wavelength $\lambda_2$. This procedure will compensate for background light and light from the control pulses. Therefore, the stabilisation will be more accurate. Thus, the electrical output from the circuit 36 corresponds to the difference between its inputs and is applied to the element 3 so as to electrically control its optical gain.

Figure 19:
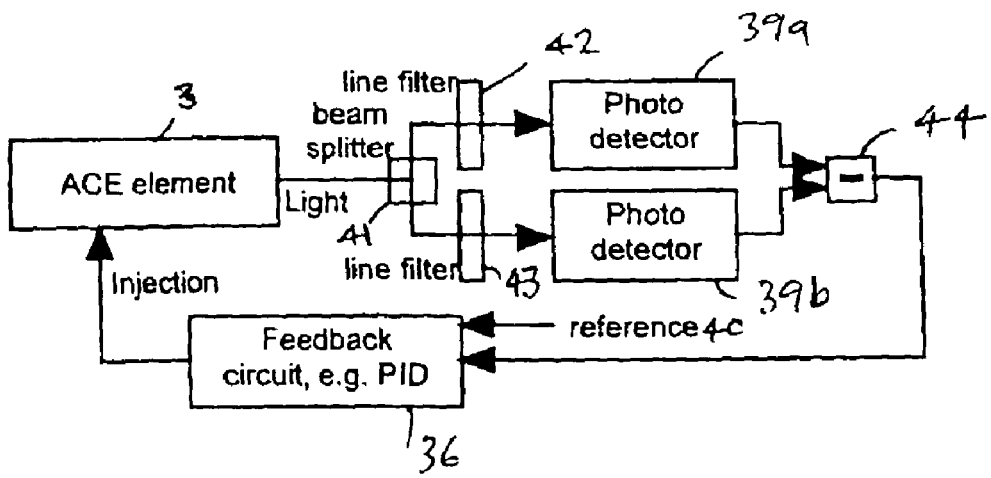
FIG. 19 is a more detailed schematic diagram of an ACE element connected in a feedback loop utilising a differential filtering and detecting arrangement.
Figure 20:
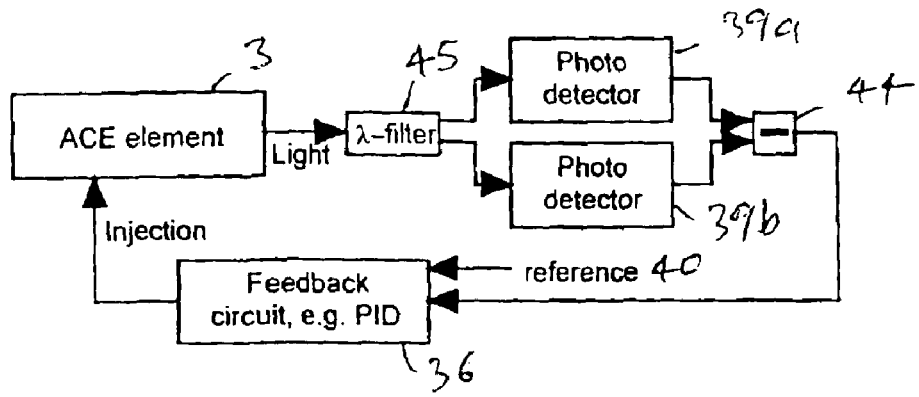
FIG. 20 is a schematic diagram of an ACE element connected in a feedback loop utilising another differential filtering and detecting arrangement.

FIG. 19 shows an implementation example of the feedback loop with differential detection. The light from the ACE element 3 is split and filtered by beam splitter and line filter arrangement 41, 42, 43 (e.g. by an interference filter, a Fabry Perot Filter, a fibre grating filter, an arrayed waveguide filter, or any other filter used for DWDM technology) such a way that light with wavelength $\lambda_1$ and $\lambda_2$ from the ACE element 3 is detected by first and second photodetectors 39a, 39b respectively. A difference signal corresponding to the difference between the outputs of the photodetectors 39a, 39b is produced by a subtractor circuit 44 and is fed into the feedback circuit as before. Alternatively, the light from one of the photodetectors 39a, 39b can be fed into the signal input of the feedback circuit 36 and the signal from the other detector can be used as reference 37 and fed into the reference input 40. FIG. 20 shows an implementation without a separate beam splitter, in which a wavelength filter or DWDM multiplexer 45 separates $\lambda_1$ and $\lambda_2$.

Figure 21:
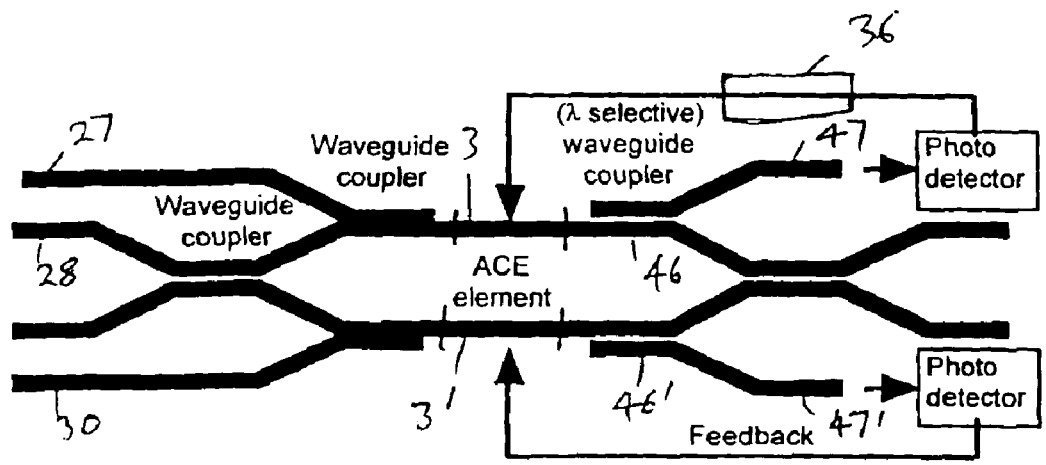
FIG. 21 is a diagram of practical implementation of the ACE element connected in the feedback loop, in an interferometer arrangement.

FIG. 21 shows the implementation of the feedback in a Mach Zehnder optical switch with ACE elements 3,3', that operates generally as described previously with reference to FIG. 8B. Like parts in FIGS. 8B and 21 are marked with the same reference numbers. Thus, temporally spaced switching pulses $P_1$ and $P_2$ may be applied to waveguide 27 and a signal pulse $P_3$ applied to waveguide 28, and the signal pulse $P_3$ passes to output waveguide 29 only if it occurs between the occurrences of pulses $P_1$ and $P_2$. Light from the CC mode is coupled out by a wavelength selective waveguide coupler 46 into waveguide 47 and detected by photodedector 49, which can be implemented on chip. A feedback circuit 36 utilized in a circuit as shown in any of FIGS. 18–20, controls the ACE element 3 so as to extend its coherence time. Corresponding components 46', 47', 39' and 36' may be provided for the other ACE element 3' of the interferometer.

Whilst in the foregoing, the feedback circuit 36 produces electrical injection into the element (3) it will be understood that optical injection could be used in the feedback loop.

Figure 22:
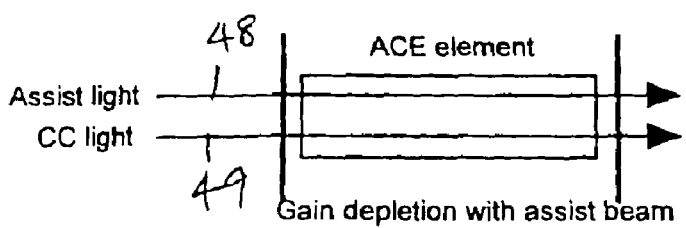
FIG. 22 is schematic diagram of an ACE element in which an assist beam is used for gain control purposes.

(3) Gain Depletion by Injected Light:

An optical assist beam 48 injected into the ACE element 3 can be used to deplete the carrier density, $n_{tot}$, and to adjust $g_{rCC}<1$, as shown in FIG. 22. In this example, the ACE element 3 comprises a quantum well device. The assist beam 48 reduces $n_{tot}$ by stimulated emission if the photon energy of the assist beam $\omega_A$ is lower than the transparency energy $\omega_{Tr}$, namely the energy at which light is neither amplified nor absorbed by the element 3, i.e. $\omega_A<\omega_{Tr}$. Conversely, the assist beam 48 increases the carrier density if $\omega_A>\omega_{Tr}$ as can be seen from FIG. 23. Since a change in $n_{tot}$ shifts $\omega_A$, a sufficiently strong assist beam will enforce $\omega_A=\omega_{Tr}$ and act like a feedback circuit to keep carrier density and gain constant, in a similar way to the control of injection power described in paragraph (2) above, but with a higher feedback speed defined by optical time constants rather than by the speed of the electrical feedback circuit 36. The assist beam 48 also can be used in a regular feedback loop, as shown in FIG. 24, with a feedback controller 50. This controller 50 works in a very similar fashion as the control circuit used in the control of the injection shown in FIGS. 13–21. FIG. 25 shows the output intensity of the CC mode from the element 3 versus the intensity of the assist beam 48 for the case in which the photon energy of the assist beam is below the transparency point, $\omega_A<\omega_{Tr}$, and FIG. 26 illustrates the case where $\omega_A>\omega_{Tr}$. In the first case shown in FIG. 25, the assist beam reduces the CC mode intensity, whereas in the second case shown in FIG. 26, the CC mode intensity is increased. The intensity of the assist beam intensity is stabilised to the value indicated by arrow 51, which is just below the threshold for the CC mode.

Figure 27:
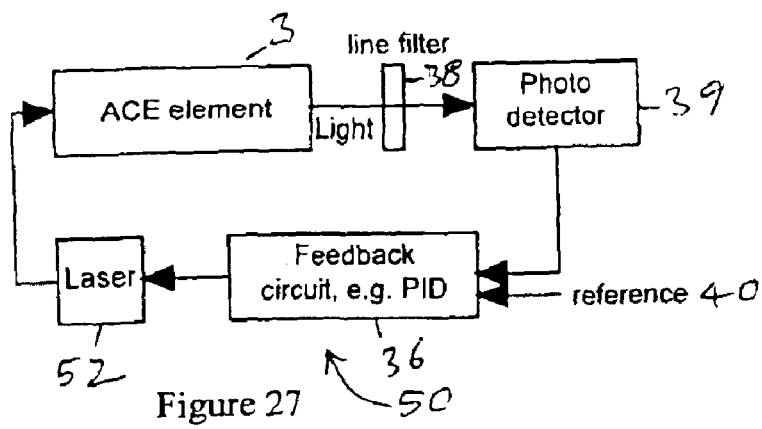
FIG. 27 is a schematic diagram of an ACE element connected in a feedback loop for the assist beam.

FIG. 27 shows a more detailed diagram of the feedback loop, which works generally in the same way as the circuit in FIG. 18 (with the same parts being marked with the same reference numbers) but with the exception that a laser 52 e.g. semiconductor laser, converts the output of the feedback circuit 36 into light to produce the assist beam 48. In the case $\omega_A<\omega_{Tr}$, the feedback circuit operates in an inverted mode since increased assist beam intensity reduces the CC mode intensity. The differential photodetector arrangement 39a,b shown in FIG. 19 and 20 can be applied here too.

Figure 28:
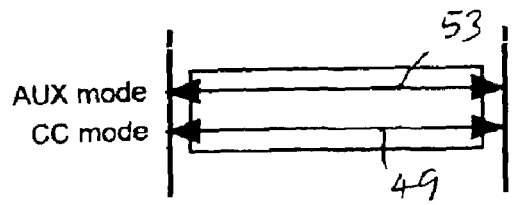
FIG. 28 is a schematic illustration of an ACE element in which coherent control of a mode is achieved through the agency of an auxiliary mode.
Figure 29:
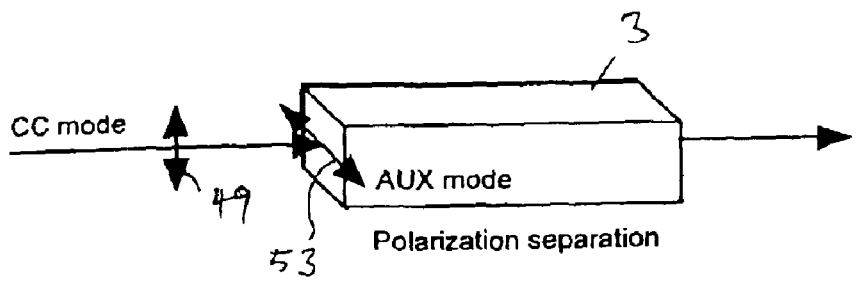
FIG. 29 illustrates the relative polarisation of the coherent control mode and the auxiliary mode in relation to a semiconductor waveguide containing the ACE element.

(4) Gain Control Using an Auxiliary Mode:

Referring to FIG. 28, an auxiliary optical transmission mode 53 in the ACE element 3 with sufficiently high roundtrip gain in the stationary regime will deplete the gain for the CC mode 49 until $g_{rAux}=1$ if it is the mode with the highest gain. We then get $g_{rCC}<g_{rAUX}=1 \Rightarrow g_{rCC}<1$, which is the required condition. This technique is especially useful if $0<1-g_{rCC}<<1$ is required in order to achieve a long coherence time. In this case, two modes are selected that have very similar gain. The auxiliary mode may have a number of different configurations in relation to the CC mode and three different examples will now be described:

I. FIG. 29 shows a case in which the coherent control mode 49 and the auxiliary mode 53 are different polarisation modes. The auxiliary mode will deplete the coherent control mode as long as there is enough spatial overlap for interaction. Examples are different transverse or longitudinal modes in a horizontal (light propagation parallel to the wafer plane) or vertical (light propagation perpendicular to the wafer plane) semiconductor laser or waveguide.

Figure 30:
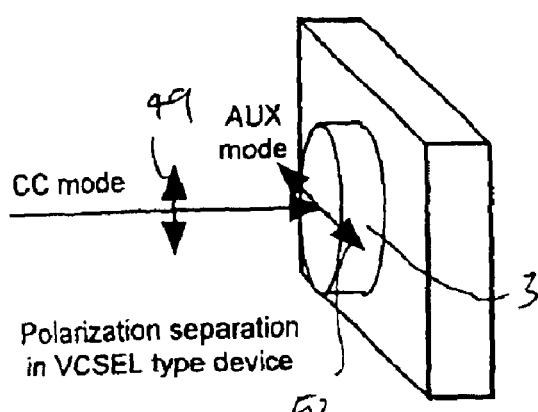
FIG. 30 illustrates the relative polarisation of the coherent control mode and the auxiliary propagation mode in relation to a vertical semiconductor laser containing the ACE element.

II. Also FIG. 29 together with FIG. 30 illustrate cases in which the coherent control mode 49 and the auxiliary mode 53 have different polarisations. The relative roundtrip gain for the element 3 can be adjusted for example by the use of material combinations with different lattice constants to induce strain or modification of the band structures (e.g. $Al_xGa_{1-x}As/In_yGa_{1-y}As$, $InP/InyGa_{1-y}As$), by structures with the right symmetry or by crystal growth in special lattice directions (e.g. 311). FIG. 29 shows the example of a horizontal waveguide, and FIG. 30 shows the example of a vertical cavity surface emitting laser previously described with reference to FIG. 7D. In the second case it is especially useful to break the symmetry in the different polarisation directions in order to adjust the relative optical roundtrip gain for the different directions.

Figure 31:
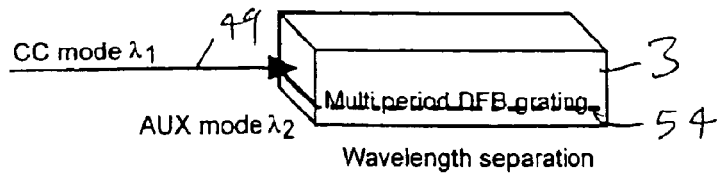
FIG. 31 illustrates the disposition of the coherent control mode and the auxiliary propagation mode in relation to a semiconductor waveguide containing an ACE element that comprises a multi-periodic grating.
Figure 32:
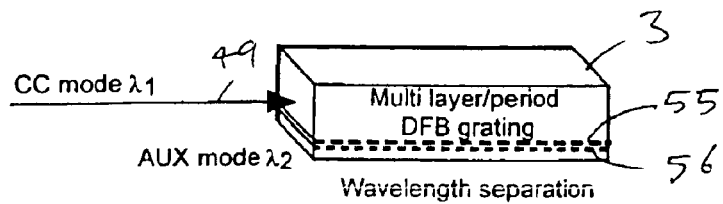
FIG. 32 illustrates the disposition of the coherent control mode and the auxiliary propagation mode in relation to a semiconductor waveguide containing an ACE element that comprises a multi-layer grating.

III. The coherent control mode 49 and the auxiliary mode 53 can also have different wavelengths. FIG. 31 shows an example of a DFB structure with a multiple (two or more) period DFB grating 54 of a general grating structure previously described with reference to FIG. 7C. FIG. 32 shows the case of a structure with two (or more) separate DFB gratings 55, 56 which are in different layers of the element structure 3 in the example shown. Index gratings as well as gain gratings are possible.

Figure 33:
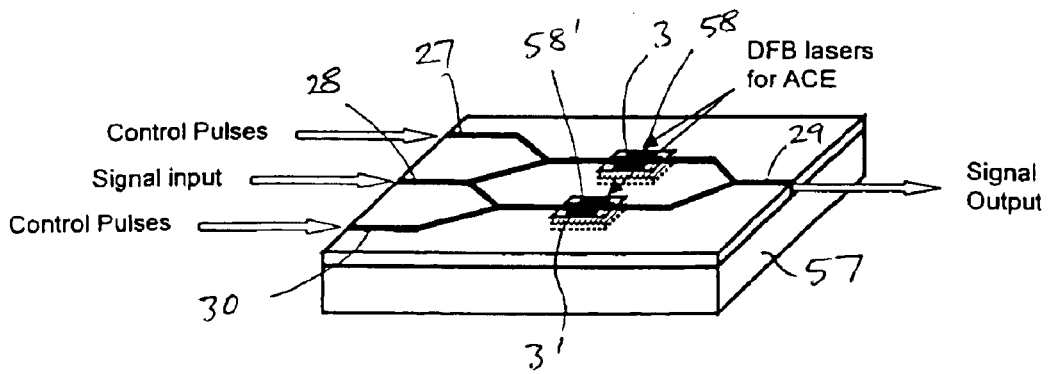
FIG. 33 is a schematic illustration of a semiconductor optical switching device comprising an interferometer that includes DFB laser ACE elements.

FIG. 33 shows an optical switch configured generally as shown and described with reference to FIG. 8B with waveguides formed in a semiconductor substrate 57 in a manner known per se and described "Guided Wave Optoelectronics" supra. The ACE elements 3, 3' are implemented by DFB lasers 58, 58' mounted on the substrate. Alternatively the ACE elements can be implemented by DFB lasers integrated into a monolithic, integrated semiconductor device that incorporates the waveguides. In another modification the waveguides may be formed separately so as to overlie the substrate, for example polymer waveguides formed on a silicon or indium phosphide substrate.

Figure 34:
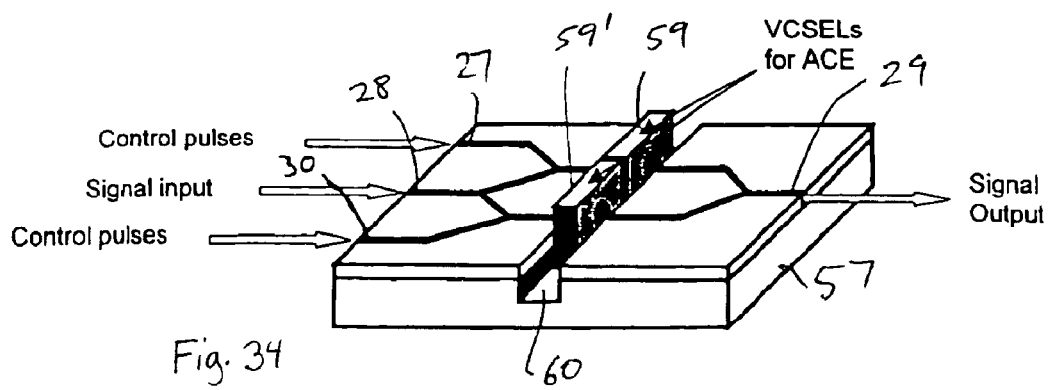
FIG. 34 is a schematic illustration of a semiconductor optical switching device comprising an interferometer that includes vertical cavity laser ACE elements.

FIG. 34 illustrates another optical switch, similar to that shown in FIG. 33, but with the ACE elements 3,3' being implemented by VCSELs 59, 59'. The VCSELs either can be mounted in a slot 60 as shown or rotated by 180 degrees so that the light first enters the active layers and then goes through the substrate.

In the above cases the signal light can propagate either in the same direction as the control pulses (as shown) or in the opposite direction (from right to left). Propagation delay and necessary switch speed determine which of the two possibilities is best.

Figure 35:
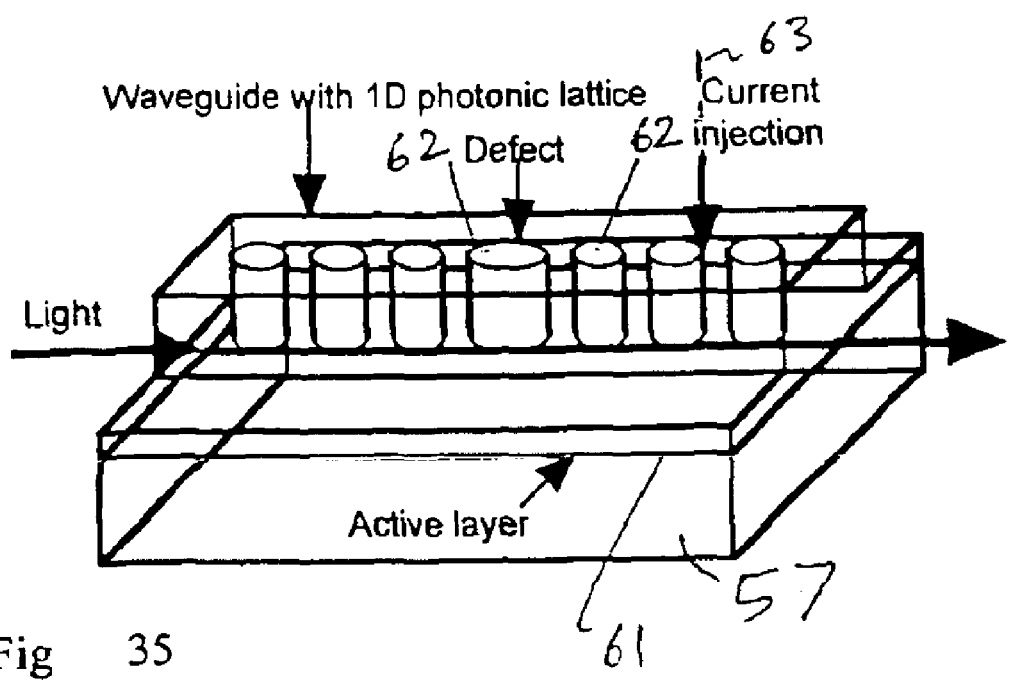
FIG. 35 is a schematic perspective view of a ACE element that includes a quasi one dimensional photonic element.

FIG. 35 shows an implementation of the ACE element 3 by means of a photonic crystal laser. The example shows a 1-dimensional photonic crystal formed as an active layer 61 on substrate 57. The photonic crystal 61 confines the light at one or more defects in the photonic lattice formed by holes 62 in this example. The defects can be holes with different sizes, no hole, a phase shift in the lattice or any other disturbance in the periodicity of the lattice. Several defects can be introduced to tailor the spectrum of the device. The device can be pumped electrically as shown schematically by arrow 62 or optically. The waveguide is a ridge waveguide with amplifying active layer below the waveguide in this example, but other types of waveguides, such as a buried waveguide, are also possible. The active layer can be implemented for example by quantum wells, quantum wires, quantum dots or bulk semiconductor material. The active layer also can be inside the waveguide or below the waveguide to avoid surface recombination.

In the examples described hereinbefore, the resonant optical system makes use of an optically responsive medium 3 which is capable of being switched into a state of coherent resonance. However, other optically resonant systems can be used. For example, the optically resonant system may comprise a resonant cavity which is excited into resonance by the first pulse $P_1$ and at least partially de-excited by the second pulse $P_2$. Thus the resonant characteristics of the cavity itself give rise to a resonance stimulated by the pulse $P_1$ which remains coherent for a time determined by characteristics of the cavity i.e. its dimensions and refractive index and is then coherently destroyed by the pulse $P_2$. In accordance with the invention, the external device such as amplifier 13 can in effect extend the duration of the natural resonance of the cavity to provide improved switching characteristics as previously described. The resonant cavity may comprise a Fabry Perot etalon containing a non-linear material such as any of the aforementioned semiconductors, to provide a change in optical characteristics when the resonance occurs, thereby modulating the light from source 4.

The devices can be used as an optical switch for an ultrafast optical memory. The on-pulse switches the memory on (light emission on) and the off-pulse switches the memory off by destructive interference (light emission off, or light emission with different polarisation). If polarisation is used to distinguish between on and off, the different polarisation states can be converted in a light-on light-off sequence by a polariser.

As used herein the term "optical radiation" includes non visible radiation including ultra-violet and infra-red.

We claim:

1. Optical switching apparatus, comprising an optically responsive system; a pulse source configuration to direct first and second pulse components of optical radiation into the optically responsive system, the first pulse component being configured to produce a coherent excitation of the optically responsive system so as to change its optical characteristics and the second pulse component being of a phase to thereafter produce de-excitation of the coherent excitation produced by the first pulse component, and a device driveable externally of the system to maintain the coherence of the excitation produced by the first pulse component until the de-excitation due to the second pulse component.

2. Apparatus according to claim 1, wherein the first and second pulse components comprise a first pulse and a second pulse.

3. Apparatus according to claim 1, wherein the optically responsive system comprises an optically responsive medium and the pulse source configuration is operable so that the first pulse component produces a resonant excitation in the optically responsive medium and the second pulse component produces de-excitation of the resonant excitation produced by the first pulse component.

4. Apparatus according to claim 1, wherein the optically responsive system comprises a resonant structure and the pulse source configuration is operable so that the first pulse component produces a resonant excitation of the structure and the second pulse component produces de-excitation of the resonant excitation of the structure produced by the first pulse.

5. Apparatus according to claim 4, wherein the resonant structure comprises a Fabry Perot etalon.

6. Apparatus according to claim 1, wherein said device comprises an optical amplifier.

7. Apparatus according to claim 6, wherein the amplifier comprises an amplifying medium configured to be driven by power from an external source to maintain the coherence of the excitation produced by the first pulse component until de-excited by the second pulse component.

8. Apparatus according to claim 6, wherein the amplifier is configured to be pumped by an external optical source, to maintain the coherence of the excitation produced by the first pulse component until de-excited by the second pulse component.

9. Apparatus according to claim 6, wherein the amplifier is configured to be driven by an external electrical power supply, to maintain the coherence of the excitation produced by the first pulse component until de-excited by the second pulse component.

10. Apparatus according to claim 1, including a saturable absorber to suppress stimulated emission in the optically responsive system.

11. Apparatus according to claim 1, wherein the optically responsive system includes an optical medium is disposed within an optical cavity.

12. Apparatus according to claim 1, including an optical grating applied to the optical system.

13. Apparatus according to claim 1, wherein the optically responsive system comprises a heterogeneous material which provides said resonant excitation and is also operable as said amplifier.

14. Apparatus according to claim 1, wherein the optically responsive system comprises multiple layered structure.

15. Apparatus according of claim 14, wherein the layered structure forms an optical grating.

16. Apparatus according to claim 1, wherein said optically responsive system is arranged in at least one arm of an optical coupler.

17. Apparatus according to claim 1, wherein said optically responsive system is arranged in an interferometer.

18. Apparatus according to claim 1, including a band stop filter, and operable to produce optical switching relative to a band stop associated with the band stop filter.

19. Apparatus according to claim 1, operable to produce a succession of said excitations wherein successive ones of said excitations are produced with different polarisations.

20. Apparatus according to claim 1, wherein said pulse source configuration is operable to produce a succession of coherent excitations of at least one of the group comprising an optical polarisation state, an optical wavelength and an optical resonant mode, of the optically responsive system.

21. Apparatus according to claim 19, wherein said succession of excitations produces an average optical intensity that is essentially constant over time as a result of said succession of excitations.

22. Apparatus according to claim 21, and optimised for the performance of the optical switching apparatus.

23. Apparatus according to claim 1, wherein the device external to the optically responsive system comprises a laser to feed coherently polarised radiation into the optical system such that the first pulse produces an excitation in charge carrier density which is maintained by the radiation until de-excited by the second pulse component.

24. Apparatus according to claim 1, including an optical source to provide a source optical beam directed at the optical system whereby the source beam is modulated by the optically responsive system.

25. Apparatus according to claim 6, wherein the amplifier is configured so that its gain for a coherently controlled mode is limited such as not to exceed unity.

26. Apparatus according to claim 25, wherein the amplifier is made of materials selected so that its gain is limited to be less than unity.

27. Apparatus according to claim 25, including a configuration to inject power into the amplifier such that its gain does not exceed unity.

28. Apparatus according to claim 25, including an arrangement to deplete or increase the gain of the amplifier with externally injected light.

29. Apparatus according to claim 25, including an arrangement to deplete the gain of the amplifier with at least one auxiliary mode.

30. Apparatus according to claim 1, including a feedback loop to control the gain or loss of the optically responsive system.

31. Apparatus according to claim 30, wherein the feedback loop is operable to control the gain or loss electrically.

32. Apparatus according to claim 30, wherein the feedback loop is operable to control the gain optically.

33. Apparatus according to claim 32, wherein the feedback loop is operable to control the gain or loss by controlling an auxiliary transmission mode for the optical system.

34. A method of performing optical switching comprising directing first and second pulse components of optical radiation into an optically responsive system, the first pulse component being configured to produce a coherent excitation of the optically responsive system so as to change its optical characteristics and the second pulse component being of a phase thereafter to produce de-excitation of the coherent excitation produced by the first pulse component, and driving the optically responsive system from externally thereof to maintain the coherence of the excitation produced by the first pulse component until the de-excitation due to the second pulse.

* * * * *